United States Patent [19]

Fasulkey et al.

[11] 4,020,397
[45] Apr. 26, 1977

[54] PARALLEL TRANSISTOR PROTECTION CIRCUIT

[75] Inventors: Robert H. Fasulkey, Fairfax, Va.; Vaughn L. Quidort, Lochearn, Md.

[73] Assignee: Westinghouse Electric Corporation, Pittsburgh, Pa.

[22] Filed: Sept. 25, 1974

[21] Appl. No.: 509,175

[52] U.S. Cl. .................... 361/24; 361/94; 361/100; 361/103

[51] Int. Cl.² ........................ H02H 7/20

[58] Field of Search ............... 317/40 R, 40 A, 41, 317/33 R, 16; 307/296, 317, 202, 293; 323/80, 94 R, 25; 219/69 P, 69 C, 69 S; 337/296

[56] References Cited

UNITED STATES PATENTS

| | | | |
|---|---|---|---|
| 2,972,096 | 2/1961 | Johnson | 317/40 R |
| 3,017,558 | 1/1962 | Kozacka | 317/40 R |
| 3,449,598 | 6/1969 | Wright | 307/202 |
| 3,588,538 | 6/1971 | Picillo | 307/202 |
| 3,604,885 | 9/1971 | Inoue | 219/69 P |
| 3,705,968 | 12/1972 | Verner | 219/69 C |
| 3,735,318 | 5/1973 | Bucklin et al. | 337/296 |
| 3,745,418 | 7/1973 | McLeod | 317/40 A |
| 3,751,622 | 8/1973 | Bell, Jr. | 219/69 C |
| 3,766,508 | 10/1973 | Wada et al. | 337/296 |
| 3,832,606 | 8/1974 | Furnival | 317/40 A |
| 3,878,437 | 4/1975 | Cuker | 317/33 SC X |

*Primary Examiner*—J. D. Miller
*Assistant Examiner*—Patrick R. Salce
*Attorney, Agent, or Firm*—J. B. Hinson

[57] ABSTRACT

A circuit arrangement for protecting the remainder of a plurality of parallely operated transistors in the event any one of the transistors fails in a shorted condition. An open circuited failure has no adverse effect upon the operating circuit. Each transistor includes a "slow" turn-off diode with respect to the period of the input drive signal, coupled in series between a common input signal-feed point and the base of the transistor to which it is connected. The diodes are poled to block the collector B+ supply potential appearing at the base of the respective shorted transistor, thus preventing the B+ supply potential from being applied to the base of the remaining transistors. Additionally, a respective fusister is connected in series between each emitter and the load circuit line in order to thereafter remove the failed transistor from the circuit and to balance the transistor currents during normal operation.

7 Claims, 2 Drawing Figures

PARALLEL TRANSISTOR PROTECTION CIRCUIT

BACKGROUND OF THE INVENTION

1. Field of the Invention

This invention relates to transistorized electrical circuitry and more particularly to a protective circuit for protecting high power transistors operated in parallel and at high frequencies.

2. Description of the Prior Art

In order to obtain high power at high frequencies, it is commonly necessary to parallel a plurality of transistors which are then operated as a composite group of like devices. This configuration can suffer catastrophic failure, however, when one of the transistors fails in a shorted condition because in a parallel circuit configuration all the bases are connected in parallel. The method heretofore used to protect the good transistors was to connect an electrical fuse in series with each base of all the transistors. Collector voltage (B+) was thus applied to all the bases when one of the transistors shorted until the fuse in the base of the shorted transistor blew. The elapsed time for clearing a fault, due to the nature of the fuse itself, was in the order of several milliseconds. However, due to the short length of "safe operating area" time for the remaining good transistors which is in the order of a few nanoseconds, the fuse will not operate sufficiently fast to prevent damage to the remaining transistors. The prior art protective schemes thus were adapted to protect the transistor to which the fuse was connected as opposed to protecting the balance of the remaining transistors from the failure of one transistor.

The applicant has conducted a preliminary patentability search and has developed the following references which are hereby made of record:

U.S. Pat. No. 3,083,303, W.S. Knowles et al.
U.S. Pat. No. 3,490,031, I.R. Marcus et al.
U.S. Pat. No. 3,703,648, J.A. Wrabel.
U.S. Pat. No. 3,729,655, W. Gratzke.

SUMMARY

Briefly, the present invention is directed to a circuit arrangement for protecting the remainder of a plurality of semiconductor signal translation devices, e.g. transistors, operated as a composite group of parallel devices in the event any one of said devices fails catastrophically such as becoming shorted. The circuit includes: input means, having a common circuit node, adapted to receive an input signal; a plurality of semiconductor signal translation devices, each having at least one control terminal and first and second power terminals; a respective diode having a relatively slow turn-off time with respect to the frequency of the input signal, coupled in series between the control terminal of each of said plurality of devices and said common circuit node with each said diode being poled to block supply potential commonly applied to one of said power terminals of all the devices from said common circuit node in the event of a failure occurring in the respective device, said diodes additionally having a turn-off time substantially faster than an electrical fuse; means commonly coupling said first power terminal of said plurality of devices to a supply potential; respective fuse means coupled in series between said second power terminal of each of said plurality of devices and a second common circuit node for electrically removing the respective device from the composite set in the event of said failure occurring in the respective device as well as balancing the current between said devices during normal operation; and means commonly connecting said second common circuit node to a load circuit.

DESCRIPTION OF THE PREFERRED EMBODIMENT

Figure 1:
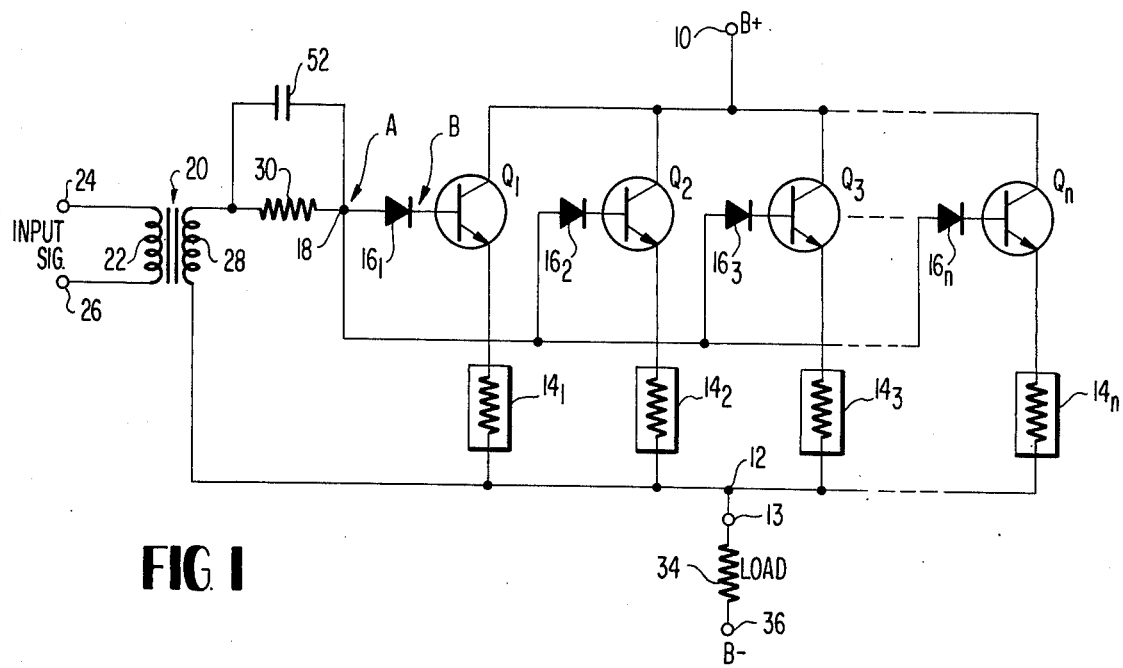
FIG. 1 is a schematic diagram illustrative of the preferred embodiment of the subject invention.

Referring now to the drawings and more particularly to FIG. 1, there is shown a plurality of semiconductor signal translation devices, more particularly N-P-N junction transistors $Q_1$, $Q_2$, $Q_3$ . . . $Q_n$ connected in a parallel circuit configuration. Each transistor includes a current control terminal commonly referred to as the base and a pair of power terminals commonly referred to as, respectively, the collector and emitter. In the embodiment shown in FIG. 1, all of the collectors are directly connected in parallel to a B+ power supply potential applied to terminal 10, from a source, not shown. Each emitter on the other hand is coupled to a common circuit node 12 through a respective series connected fusister $14_1$, $14_2$, $14_3$ . . . $14_n$. A fusister is a well known device which not only operates as an electrical fuse, but also exhibits an appreciable resistive impedance for a fuse device having a value in the order of 0.01 to 0.1 ohm.

In series with the base of each of the transistors $Q_1$, $Q_2$, etc. is a respective semiconductor diode $16_1$, $16_2$, $16_3$ . . . $16_n$. The opposite side of the diodes connect in parallel to a common circuit node 18 to which is applied an input drive signal supplied thereto by means of an input circuit including a transformer 20 whose primary winding 22 is coupled across a pair of input signal terminals 24 and 26. The secondary winding 28 has one end coupled to the circuit node 18 by means of the parallel combination of resistor 30 and capacitor 52 which is adapted to act as a bias network. The opposite end of the secondary winding 28 is connected to the common connection of the fusisters $14_1$, $14_2$ . . . $14_n$, i.e. at the common circuit node 12. An output terminal 13 common to the node 12 is connected to an external load 34 which is also adapted to connect to a B- power supply potential applied to terminal 36.

All of the diodes $16_1$ . . . $16_n$ are poled in exactly the same manner to its respective transistor base terminal in order to prevent or block the B+ supply potential from appearing at all of the remaining base terminals in the event that the one transistor fails and becomes shorted at which time B+ appears at its base terminal. For example, diode $16_1$ has its anode electrode coupled to circuit node 18 which its cathode electrode is directly connected to the base of transistor $Q_1$. The diode $16_1$ becomes back-biased, i.e. non-conductive, in the event that transistor $Q_1$ catastrophically fails. The B+ supply voltage is thus prevented from being applied to circuit node 18 and accordingly to the base terminals of the remaining transistors $Q_2$ . . . $Q_n$ through their respective diodes $26_2$ . . . $16_n$ long enough to damage the transistors. It is to be noted that semiconductor devices, e.g., diodes and transistors, do not turn off instantaneously but have discrete turn-off times which is directly related to the reverse current required to flow through the device before turn-off. Accordingly, the diodes $16_1$, $16_2$ are particularly selected with reference to the frequency of the input signal, but in any event operate much, much faster than electrical fuse devices which blow too slowly to prevent the damage that the instant diodes do.

Figure 2:
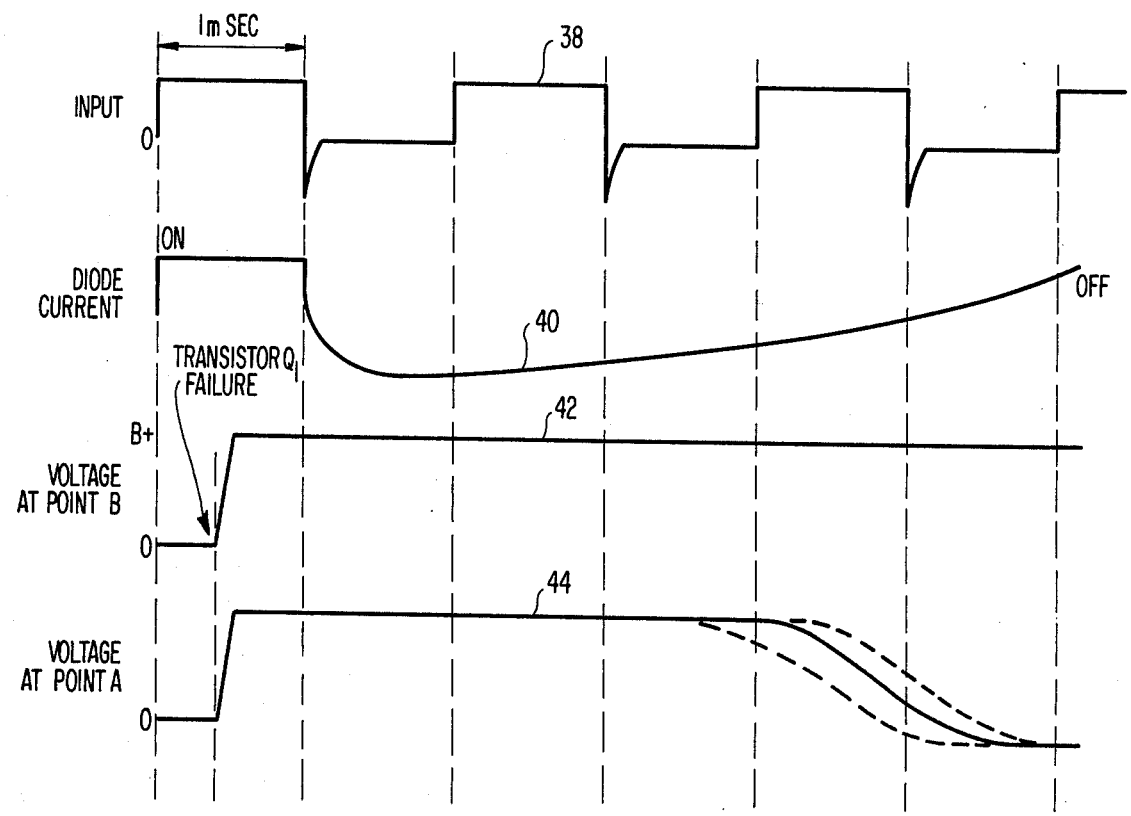
FIG. 2 is a series of time related waveforms helpful in understanding the operation of the embodiment shown in FIG. 1.

Referring now to the waveforms of FIG. 2, the base drive, that is, the input signal is shown to have a frequency (*f*) in the order of 500 KHz and constitutes a squarewave such as shown by waveform 38. The period (1/*f*) of this signal is 2 microseconds. The diodes $16_1$, $16_2$, etc. are selected to have a turn-off time greater than the period of the drive signal, being in the order of, for example, 5 microseconds as shown by waveform 40 so that during normal operation the diodes do not turn off but operate as bilateral devices permitting the respective transistors $Q_1, Q_2 \ldots Q_n$ to turn on and off in accordance with the input drive signal. This is due to the fact that the reverse current required to turn off the transistors during each cycle is unimpeded.

In the event that one transistor, for example transistor $Q_1$ becomes shorted, the voltage at the base designated point B shown in FIG. 1 suddenly rises to the amplitude of the B+ supply potential which is shown by the waveform 42. Since the base diode 161 does not turn off instantaneously, the voltage at circuit node 18 designated point A also rises to the B+ level shown by waveform 44. Waveform 40 further indicates that the turn-off time for the diode $16_1$, that is the time that the reverse current through the diode occurs, until nonconduction is in the order of 5 microseconds. The B+ voltage at point A will thus remain at node 18 until the diode $16_1$ recovers and becomes non-conductive which as noted above, is a time dependent upon the reverse current. Accordingly, in the event that transistor $Q_1$ fails, the B+ will be applied to the base terminals of the remaining transistors $Q_2, Q_3 \ldots Q_n$ for a period of time it takes diode $16_1$ to turn off which is in the order of 4–5 microseconds. This time is insufficient, however, to cause damage to the other parallel transistors. It is to be noted that if electrical fuses were present instead of the series connected base diodes $16_1$, etc. the fuse would have taken 5–10 milliseconds to blow and additional transistor damage would have been imminent.

It is also to be noted that subsequent to a transistor's failure, for example $Q_1$, and the protective action afforded the remainder of the transistors $Q_2 \ldots Q_n$ by the turn off of diode $16_1$, the fusister $14_1$ will additionally blow 5–10 milliseconds later to entirely remove transistor $Q_1$ from the parallel circuit. Thus, both the respective diode $16_1$ and fusister $14_1$ act to protect the balance of the circuitry in the event of the failure of transistor $Q_1$. It should also be pointed out that a fusister is preferred as the element connected in series with the emitters in that the resistive impedance exhibited by these devices when commonly connected to the load 34 as shown in FIG. 1 is adapted to balance the current between all the parallel transistors in normal operation.

Thus what has been shown and described is an improved means of protecting the remainder of high power transistors operated in parallel when one of the transistors suffers catastrophic failure.

We claim:

1. A circuit arrangement for protecting the remainder of a plurality of semiconductor devices operated as a composite group in the event of any one of said devices fails in a shorted condition, comprising in combination;
    input means having a common circuit node, adapted to receive an input signal;
    a plurality of semiconductor signal translation devices each having at least one control terminal and first and second power terminals;
    a respectively relatively slow operating protection diode coupled in series between the control terminal of each of said plurality of devices and said common circuit node of said input means, each said diode being poled to block supply potentials from said circuit node in the event of failure occurring in the respective device, and having a turn-off time greater than the period of the input signal in order to be turned on continuously during normal operation upon application of said input signal; however, said turn-off time being substantially faster than an electrical fuse device and thus preventing any prolonged application of said supply potential to the control terminals of the remainder of said devices;
    means commonly coupling said first power terminal of said plurality of devices to a power source;
    a load circuit; and
    means coupled in series between each second terminal of said plurality of devices and said load circuit, said circuit means having a predetermined resistive impedance value for effecting current balance between said plurality of devices during normal operation and becoming operable after a predetermined time greater than the turn-off time of said diode to electrically remove the respective device from said circuit arrangement upon failure of said device.

2. The circuit arrangement as defined by claim 1, wherein said circuit means comprises fusing means.

3. The circuit arrangement as defined by claim 2, wherein said fusing means comprises a fusister.

4. A circuit arrangement for protecting the remainder of a plurality of semiconductor devices operated as a composite group in the event any one of said devices fails in a shorted condition, comprising in combination:
    input means, having a common circuit node, adapted to receive an input signal;
    a plurality of semiconductor signal translation devices each having at least one control terminal and first and second power terminals;
    a respective relatively slow operating protection diode coupled in series between the control terminal of each of said plurality of devices and said common circuit node of said input means, each said diode being poled to block supply potentials from said common node in the event of failure occurring in the respective device, and having a turn-off time at least greater than one cycle of the input signal in order to be turned on continuously during normal operation upon application of said input signal; however, said turn-off time being substantially faster than an electrical fuse device and thus preventing any prolonged application of said supply potential to the control terminals of the remainder of said devices;
    means for coupling said first power terminal of said plurality of devices to a power source;
    a load circuit;
    circuit means coupling each second terminal of said plurality of semiconductor signal translation devices to said load circuit, said circuit means having a predetermined resistive impedance value for effecting current balance between said plurality of semiconductor signal translation devices during normal operation and becoming operable after a predetermined time greater than the turn-off time of said diode to electrically remove a failed semiconductor signal translation device from said circuit arrangement; and circuit means for coupling said load circuit to a second terminal of said power source.

5. A circuit arrangement for protecting the remainder of a plurality of parallely operated transistors in the event any one of said transistors fails, e.g. by shorting comprising in combination:

input means including a common circuit node adapted to provide an input drive signal;

a plurality of like transistors each having base, collector and emitter terminals;

a respective relatively slow turn-off diode with respect to the frequency of the input signal coupled in series between the base of each of said transistors and said common circuit node, each said diode being connected in the same polarity relationship and being operable to block supply potential from being coupled to said common circuit node in the event of failure of the respective transistor to which it is connected;

means commonly coupling said collector terminal of each of said transistors directly to a supply potential;

respective fuse means coupled in series with the emitter terminal of said plurality of transistors in parallel to a second common circuit node, said fuse means subsequently becoming operable in the event of the failure of the respective transistor at a time later than the turn off of the respective diode coupled to the base terminal for electrically disconnecting the respective transistor from the circuit arrangement; and a load circuit coupled to said second common circuit node.

6. The circuit arrangement as defined by claim 5, wherein the respective fuse means additionally includes electrical resistance of predetermined ohmic value adapted to effect current balance between the plurality of transistors during normal operation.

7. The circuit arrangement as defined by claim 6, wherein said fuse means comprise fusisters having an ohmic value of less than 1.0 ohms.

* * * * *